(12) United States Patent
Pye

(10) Patent No.: US 8,660,833 B2
(45) Date of Patent: Feb. 25, 2014

(54) METHOD, COMPUTER PROGRAM PRODUCT AND APPARATUS FOR PROVIDING AN INTERACTIVE NETWORK SIMULATOR

(75) Inventor: Jonathan Pye, Pittsburgh, PA (US)

(73) Assignee: McKesson Financial Holdings, Hamilton (BE)

( * ) Notice: Subject to any disclaimer, the term of this patent is extended or adjusted under 35 U.S.C. 154(b) by 957 days.

(21) Appl. No.: 12/647,935

(22) Filed: Dec. 28, 2009

(65) Prior Publication Data

US 2011/0161063 A1    Jun. 30, 2011

(51) Int. Cl.
*G06F 17/50* (2006.01)
*G06G 7/62* (2006.01)

(52) U.S. Cl.
CPC .................. *G06F 17/5022* (2013.01)
USPC ............................. 703/13; 703/27

(58) Field of Classification Search
USPC ............................. 703/13, 22, 27
See application file for complete search history.

(56) References Cited

U.S. PATENT DOCUMENTS

| | | | | |
|---|---|---|---|---|
| 5,410,681 A * | 4/1995 | Jessen et al. | | 703/27 |
| 6,330,518 B1 * | 12/2001 | Colson | | 702/123 |
| 7,117,411 B2 * | 10/2006 | McNeely et al. | | 714/724 |
| 7,921,345 B2 * | 4/2011 | Trump et al. | | 714/733 |
| 2002/0162059 A1 * | 10/2002 | McNeely et al. | | 714/703 |
| 2005/0114241 A1 * | 5/2005 | Hirsch et al. | | 705/35 |
| 2005/0132228 A1 * | 6/2005 | Ende | | 713/201 |
| 2011/0131011 A1 * | 6/2011 | Blackledge | | 702/186 |

* cited by examiner

*Primary Examiner* — Eunhee Kim
(74) *Attorney, Agent, or Firm* — Alston & Bird LLP (57) ABSTRACT

An apparatus for providing an interactive network simulator may include processing circuitry configured to at least perform receiving an indication of messages or responses exchanged between a testing platform simulating one or more external systems and a system under test, storing data corresponding to the indications received, and providing for a visual display of information related to the indications received to a user interacting with the testing platform. A corresponding method and computer program product are also provided.

21 Claims, 5 Drawing Sheets

METHOD, COMPUTER PROGRAM PRODUCT AND APPARATUS FOR PROVIDING AN INTERACTIVE NETWORK SIMULATOR

TECHNOLOGICAL FIELD

Embodiments of the present invention relate generally to software testing technology and, more particularly, relate to an apparatus, computer program product and method for providing an interactive network simulator.

BACKGROUND

Paper served as the basic medium for handling information for the health care industry for many years. From the scholarly work reporting on medical studies, to health records and prescriptions, nearly every aspect of health care related information and processes was formerly managed using paper. However, as the amazing potential of network computing has been applied to the health care industry, many of the old ways are rapidly changing.

By implementing computers and network computing into the health care industry, information management and the actual provision of medical care has rapidly improved. As evidenced by the development of electronic medical records, the ability to handle prescriptions and order entries electronically, and the development of numerous software and hardware electronic devices that improve capabilities in all areas of providing medical services, the health care industry is in a period of rapid change.

As indicated above, part of the rapid change being experienced in the health care industry is occurring in relation to the development of new software for improving various aspects of information management by developing new services and applications associated with network computing environments. The services and applications that are developed, and continue to be developed are typically supported by a combination of hardware platforms and corresponding software. For example, a new software release may be planned for integration on a computer system that interacts with other existing and perhaps external systems. Accordingly, it is important that, when developing a new software release, compatibility and interoperability be accounted for with respect to the external systems. However, new software is often produced with some level of urgency to get to market and significant risk of damage to marketability if potential problems are not identified prior to release. Thus, it may be important that software testing be enabled to start as early as possible from a business perspective, in order to ensure that overall time in getting a quality product to market can be minimized.

To accomplish the task of enabling testing for interoperability, developers typically need to "fake" the corresponding external systems. Currently, there are static, preconfigured simulators that are typically employed to conduct testing with third party live test networks. The simulators are typically required to be configured to give a certain kind of response before activity is started. Then, orders may be processed to generate the configured response. Accordingly, for different responses, activity must be stopped in order to reconfigure the simulator to provide the corresponding different response.

For interaction with a relatively simple external system, the above described mechanism for testing may be adequate, although a bit in flexible. However, with some new and complex systems that are currently being developed, complicated and asynchronous responses may be provided by the external networks. This makes simulators like those described above fall significantly short because, for example, the number of different kinds of messages and values of parameters in the messages can be so large and various that conventional simulators may not be able to effectively handle simulating such new and complex systems.

Accordingly, it may be desirable to provide a network simulator that may address some of the issues mentioned above.

BRIEF SUMMARY

A method, computer program product and apparatus are therefore provided that may enable the provision of an interactive network simulator. Accordingly, embodiments of the present invention may provide a mechanism by which storage may be provided for communications exchanged between a system under test and a testing platform designed to simulate network devices with which the system under test may be operable. Stored information may be made accessible by one or more users conducting testing of compatibility of the system under test with the simulated network devices. In some cases, the access may be provided via a web browser type interface provided by the testing platform. Thus, for example, compatibility testing may be accomplished by multiple individuals in a flexible and user friendly environment.

In one exemplary embodiment, a method of providing an interactive network simulator is provided. The method may include receiving an indication of messages or responses exchanged between a testing platform simulating one or more external systems and a system under test, storing data corresponding to the indications received, and providing for a visual display of information related to the indications received to a user interacting with the testing platform.

In another exemplary embodiment, a computer program product for providing an interactive network simulator is provided. The computer program product may include at least one computer-readable storage medium having computer-executable program code instructions stored therein. The computer-executable program code instructions may include program code instructions for receiving an indication of messages or responses exchanged between a testing platform simulating one or more external systems and a system under test, storing data corresponding to the indications received, and providing for a visual display of information related to the indications received to a user interacting with the testing platform.

In another exemplary embodiment, an apparatus for providing an interactive network simulator is provided. The apparatus may include processing circuitry configured to at least perform receiving an indication of messages or responses exchanged between a testing platform simulating one or more external systems and a system under test, storing data corresponding to the indications received, and providing for a visual display of information related to the indications received to a user interacting with the testing platform.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Embodiments of the present invention will now be described more fully hereinafter with reference to the accompanying drawings, in which some, but not all embodiments of the invention are shown. Indeed, embodiments of the invention may be embodied in many different forms and should not be construed as limited to the embodiments set forth herein; rather, these embodiments are provided so that this disclosure will satisfy applicable legal requirements. Like reference numerals refer to like elements throughout. Additionally, the terms "module" and "sub-module" may be used interchangeably herein to refer to a portion or part, but these terms do not necessarily suggest that the portions or parts associated therewith are isolated from each other or "modular" in that they do not, or could not, share certain code segments or instructions.

As indicated above, embodiments of the present invention are aimed at providing a mechanism by which to provide network simulation capabilities. Moreover, embodiments of the present invention may provide an interactive network simulator. Thus, rather than requiring numerous uninterruptable start and stop cycles to provide configuration of a simulator to return an acceptable response for a given query or interaction that is being simulated with an external system, embodiments of the present invention may enable use of a web browser to control a network simulator for dynamic and interruptible network simulation.

Figure 1:
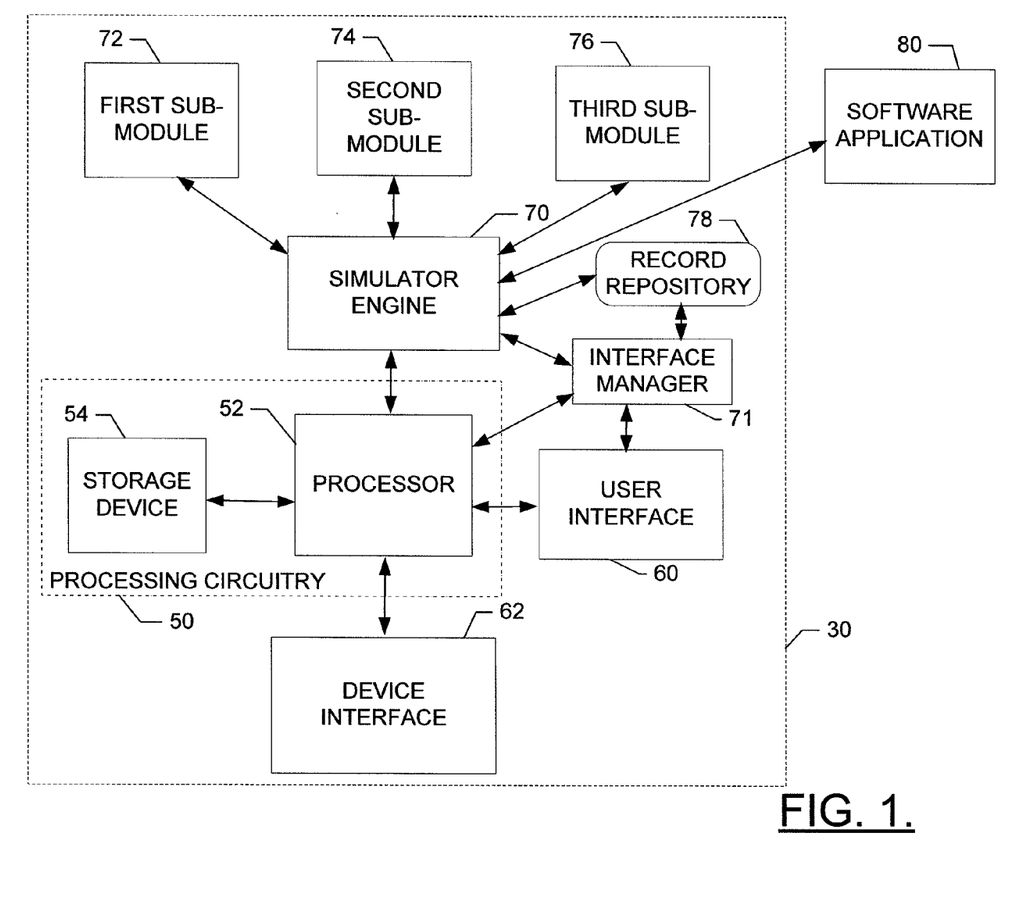
FIG. 1 illustrates a schematic block diagram of an apparatus for providing an interactive network simulator according to an exemplary embodiment of the present invention.

FIG. 1 illustrates a schematic block diagram of an apparatus for providing an interactive network simulator according to an exemplary embodiment of the present invention. The apparatus 30 may be employed in connection with a personal computer (PC) or other computing device that includes computing resources in the form of hardware such as processing circuitry and memory for storing instructions executable by the processing circuitry. As such, the PC may act as a host platform for a hardware simulating platform or virtual platform as described herein. However, it should be noted that the components, devices or elements described below may not be mandatory and thus some may be omitted in certain embodiments. Additionally, some embodiments may include further components, devices or elements beyond those shown and described herein.

Thus, according to an exemplary embodiment, the apparatus 30 may include or otherwise be in communication with processing circuitry 50 that is configured to perform data processing, application execution and other processing and management services according to an exemplary embodiment of the present invention. In one embodiment, the processing circuitry 50 may include a processor 52, a storage device 54 that may be in communication with or otherwise control a user interface 60 and a device interface 62. As such, the processing circuitry 50 may be embodied as a circuit chip (e.g., an integrated circuit chip) configured (e.g., with hardware, software or a combination of hardware and software) to perform operations described herein. However, in some embodiments, the processing circuitry 50 may be embodied as a portion of a server, computer, laptop, workstation or even one of various mobile computing devices. In situations where the processing circuitry 50 is embodied as a server or at a remotely located computing device, the user interface 60 may be disposed at another device (e.g., at a computer terminal or client device such as one of the clients 20) that may be in communication with the processing circuitry 50 via the device interface 62 and/or a network.

The user interface 60 may be in communication with the processing circuitry 50 to receive an indication of a user input at the user interface 60 and/or to provide an audible, visual, mechanical or other output to the user. As such, the user interface 60 may include, for example, a keyboard, a mouse, a joystick, a display, a touch screen, a microphone, a speaker, a cell phone, or other input/output mechanisms.

The device interface 62 may include one or more interface mechanisms for enabling communication with other devices and/or networks. In some cases, the device interface 62 may be any means such as a device or circuitry embodied in either hardware, software, or a combination of hardware and software that is configured to receive and/or transmit data from/to a network and/or any other device or module in communication with the processing circuitry 50. In this regard, the device interface 62 may include, for example, an antenna (or multiple antennas) and supporting hardware and/or software for enabling communications with a wireless communication network and/or a communication modem or other hardware/software for supporting communication via cable, digital subscriber line (DSL), universal serial bus (USB), Ethernet or other methods. In situations where the device interface 62 communicates with a network, the network may be any of various examples of wireless or wired communication networks such as, for example, data networks like a Local Area Network (LAN), a Metropolitan Area Network (MAN), and/or a Wide Area Network (WAN), such as the Internet.

In an exemplary embodiment, the storage device 54 may include one or more memory devices such as, for example, volatile and/or non-volatile memory that may be either fixed or removable. The storage device 54 may be configured to store information, data, applications, instructions or the like for enabling the apparatus to carry out various functions in accordance with exemplary embodiments of the present invention. For example, the storage device 54 could be configured to buffer input data for processing by the processor 52. Additionally or alternatively, the storage device 54 could be configured to store instructions for execution by the processor 52. As yet another alternative, the storage device 54 may include one of a plurality of databases (e.g., of the database server 42) that may store a variety of files, contents or data sets. Among the contents of the storage device 54, applications (e.g., the rational range transform manager 44) may be stored for execution by the processor 52 in order to carry out the functionality associated with each respective application.

The processor 52 may be embodied in a number of different ways. For example, the processor 52 may be embodied as various processing means such as a microprocessor or other processing element, a coprocessor, a controller or various other computing or processing devices including integrated circuits such as, for example, an ASIC (application specific integrated circuit), an FPGA (field programmable gate array), a hardware accelerator, or the like. In an exemplary embodiment, the processor 52 may be configured to execute instructions stored in the storage device 54 or otherwise accessible to the processor 52. As such, whether configured by hardware or software methods, or by a combination thereof, the processor 52 may represent an entity (e.g., physically embodied in circuitry) capable of performing operations according to embodiments of the present invention while configured accordingly. Thus, for example, when the processor 52 is embodied as an ASIC, FPGA or the like, the processor 52 may be specifically configured hardware for conducting the operations described herein. Alternatively, as another example, when the processor 52 is embodied as an executor of software instructions, the instructions may specifically configure the processor 52 to perform the operations described herein.

In an exemplary embodiment, the processor 52 (or the processing circuitry 50) may be embodied as, include or otherwise control a simulator engine 70 and an interface manager 71. The simulator engine 70 and the interface manager 71 may each be any means such as a device or circuitry that may be operating in accordance with software or otherwise embodied in hardware or a combination of hardware and software (e.g., processor 52 operating under software control, the processor 52 embodied as an ASIC or FPGA specifically configured to perform the operations described herein, or a combination thereof) thereby configuring the device or circuitry to perform the corresponding functions of the simulator engine 70 and the interface manager 71, respectively, as described below.

In an exemplary embodiment, the simulator engine 70 may include simulator software code defining a process control entity for the simulated system. As such, for example, the simulator engine 70 may be software configured to emulate a controller or processor of the system being simulated. In some examples, the simulator engine 70 may further include code or instructions for management of various modules or sub-modules corresponding to different external systems to be simulated in accordance with exemplary embodiments of the present invention as described herein. For example, one module (or sub-module) could relate to a credit processing system, another module could relate to a pill dispensing system and still another module could relate to a prescription processing system. As such, a model of the systems with which software being developed (e.g. system under test) may interact can be tested by including various sub-modules (e.g., modeled processing circuitry, memory, control registers, etc.) that describe corresponding model code that is associated with each respective system in terms of the characteristic, activity, functionality or capability of the system being simulated. Thus, for example, a first sub-module 72, a second sub-module 74, and a third sub-module 76 may each be modeled to correspond to a respective different systems and their corresponding functionalities.

In an exemplary embodiment, the sub-modules (or only one sub-module if testing is only done with respect to one external system) may be modeled based on information indicative of the possible responses that may be received from each respective sub-module for outputs from the software to be tested. As such, for example, the simulator engine 70 may include or otherwise reference an external database storing an ontology of possible responses for one or more external systems. In some cases, the sub-modules may be built based on specifications provided by the respective systems being modeled by each respective sub-module. In some cases, the specifications provided may be used to fill fields or blocks defining the ontology accessed by the simulator engine 70. However, in an alternative example embodiment, one or more of the sub-modules may actually represent an external system operating in a test mode. In such examples, the external system may provide access to systems such as the system under test to receive various test messages similar to the messages that may otherwise be provided by a model of the external system in other embodiments.

In an exemplary embodiment, the simulator engine 70 and the sub-modules (e.g., the first sub-module 72, the second sub-module 74 and the third sub-module 76) may together define a virtual testing platform comprising a software implemented model of systems that may be used to test or execute software (e.g., a software application 80, operating system, driver, middleware, etc.) via a host platform (which in this example is the apparatus 30 or more specifically the processing circuitry 50). Thus, according to an exemplary embodiment, execution of the software application 80 acting as a system under test, which may be, for example, a software package in development or testing stages, may be accomplished via the virtual testing platform. By enabling execution of the software application 80 via the virtual testing platform, performance criteria may be evaluated and responses to various interactions with respective sub-modules may be monitored.

In an example embodiment, the simulator engine 70 may store a record of each messages sent to an external system (or model thereof) and the corresponding response received by the software application 80 in response to the message sent. In some cases, the records may be stored in a record repository 78. The record repository 78 may be a portion of the storage device 54 or some other memory location accessible to the simulator engine 70. The simulator engine 70 may then provide the records to the interface manager 71 for presentation to one or more users conducting testing of the software application 80. However, in some embodiments, the interface manager 71 may access the record repository 78 directly.

The interface manager 71 may be configured to present a graphic display of information relating to the testing conducted by the simulator engine 70 via the user interface 72. As such, for example, the interface manager 71 may be configured to manage presentation of content (e.g., content regarding messages sent and responses received between the system under test and external systems) to one or more users. In an example embodiment, contents of the record repository 78 may be presented by the interface manager 71 via a web page offered in a web browser interface. Thus, a user conducting testing of the software application 80 may be enabled to view a record of the messages sent from the software application 80 and responses received from sub-modules being modeled for testing of the software application 80 in a relatively easy to digest format that is familiar to many users.

As indicated above, the interface manager 71 may provide the display to multiple users. Thus, in an example embodiment, multiple different users may be enabled to conduct testing of the software application 80 (or system under test). In some cases, the interface manager 71 may be configured to provide only the messages and corresponding responses that are associated with the particular user conducting the corresponding testing. In other words, if multiple users are conducting testing, a particular user may only be provided with a graphic display of the messages and responses that correspond to the testing the particular user is conducting. Thus, the particular user will not be burdened with having to filter through messages and responses that do not relate to the particular user's testing. Instead, each user may be enabled to receive information specific to the user's own testing activities via the web browser of the user at the user's respective computer or access terminal that may remotely connect to the apparatus 30. In some cases, individual users may have specific user names or other identification mechanisms provided (e.g., derived from the IP address of each respective user)

associated with each user so that messages and responses can be recorded in association with the user to which such messages and responses correlate. Each message or response may be stored with the corresponding identity of the originator of the message or response (e.g., the corresponding user or the identity of the system under test component or sub-module).

In an example embodiment, the interface manager 71 may provide a mechanism by which the user may guide the testing process and thereby manage interaction with the simulator engine 70. For example, the interface manager 71 may provide a plurality of message options from which a user may select. The user may also be enabled to select values to include in messages constructed. Thus, a user crafted message, with perhaps user crafted values, may then be provided to the software application 80. The user may also be enabled to select specific messages or responses to receive more detailed information regarding the corresponding messages or responses. As such, the interface manager 71 may display potential requests that may be received from any one of the sub-modules. Accordingly, the user can select a request to which the user would like to provide a response.

Figure 2:
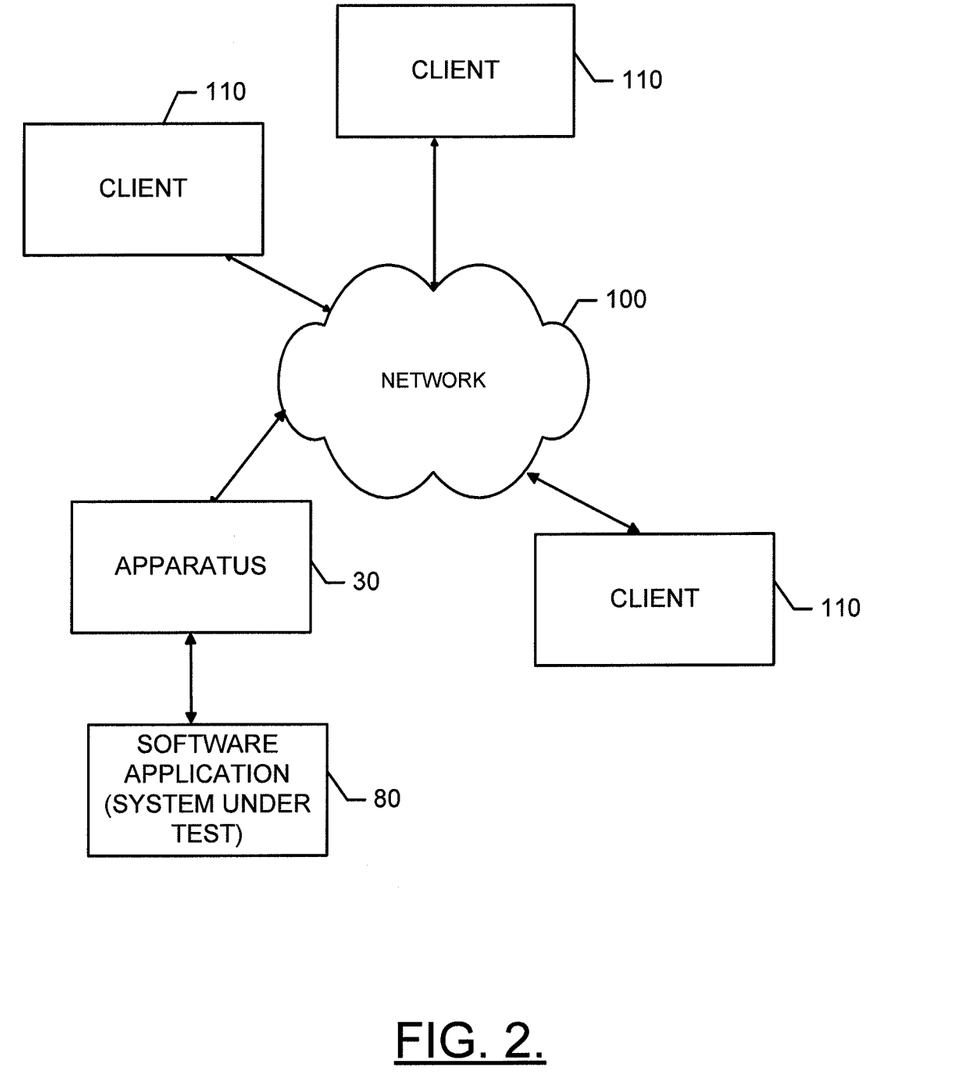
FIG. 2 illustrates a network environment for the apparatus for providing an interactive network simulator according to an exemplary embodiment of the present invention.

In some embodiments, the interface manager 71 may provide the interface via Java REST servlets to service an Internet browser on a computer of a user conducting testing (e.g., a tester) using AJAX technology, Javascript and/or XML. Thus, for example, the tester may have a PC or other computer terminal that is used to remotely access (e.g., via a network) the apparatus 30. FIG. 2 shows an exemplary network 100 by which the user may be enabled to access the apparatus 30. In an exemplary embodiment, the network 100 may include the apparatus 30, to which various clients 110, computers, databases, servers or other like devices may be operably connected. As shown in FIG. 2, one or more clients 110 (e.g., PCs or other computing devices) may be enabled to access the apparatus 30 via the network 100. The network 100 may be a data network, such as a local area network (LAN), a metropolitan area network (MAN), a wide area network (WAN) (e.g., the Internet), and/or the like, which may couple clients 110 to devices such as processing elements (e.g., personal computers, server computers or the like) or databases. Communication between the network 100, the clients 110 and the devices or databases (e.g., servers) to which the clients 110 are coupled may be accomplished by either wireline or wireless communication mechanisms and corresponding protocols. The connection between the apparatus 30 and the clients 110 associated with various different testers (i.e., the network 100) may be considered to be a back door network. Meanwhile, the connection between the apparatus 30 and the software application 80 comprising the system under test may be considered to be a front door network.

Figure 3:
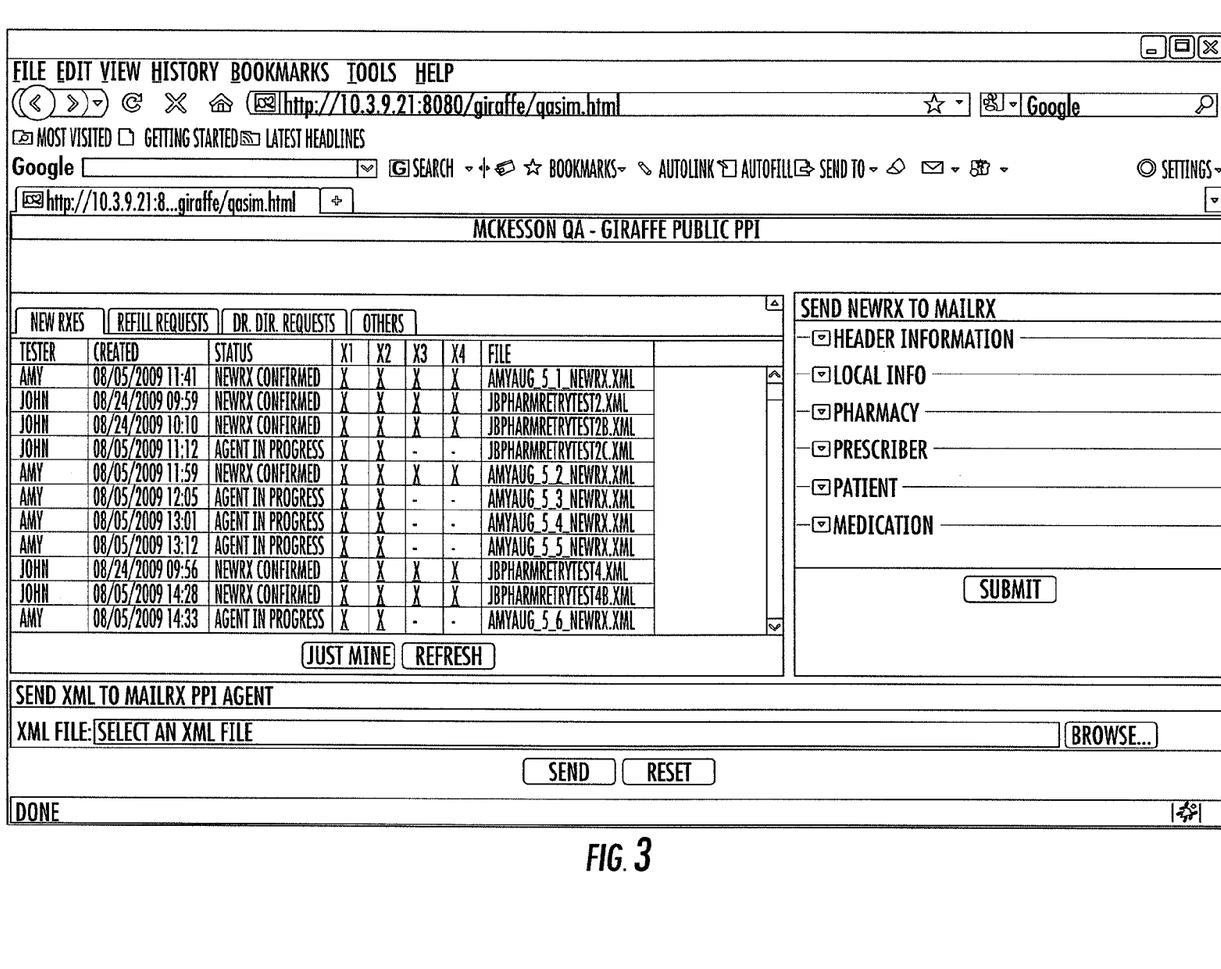
FIG. 3 is a screenshot of a web page providing a visual display of data stored and presented in accordance with an exemplary embodiment of the present invention.
Figure 4:
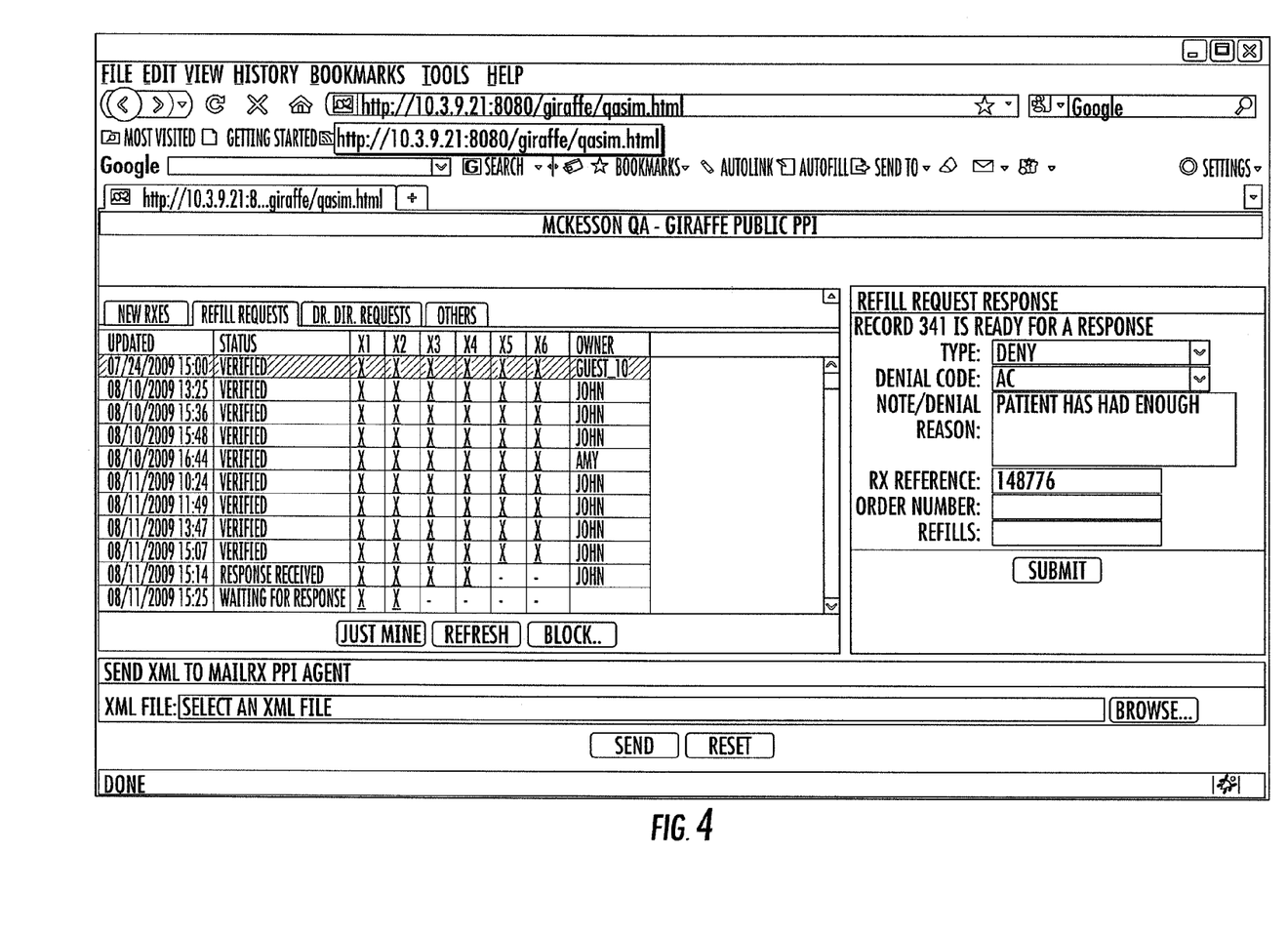
FIG. 4 is a screenshot of another web page providing a visual display of data stored and presented in accordance with another exemplary embodiment of the present invention.

FIG. 3 is a screenshot of a web page providing a visual display of data stored and presented in accordance with an exemplary embodiment of the present invention. As shown in FIG. 3, each of multiple testers may be identified in association with specific messages recorded. A function may also be provided (e.g., the "just mine" button) to filter out messages by tester. As shown in FIG. 3, there may be multiple tabs or pages corresponding to different messages for different sub-modules for which testing is being conducted. FIG. 3 shows a screenshot of messages and responses for a new prescription testing module. FIG. 4 is a screenshot of another web page providing a visual display of data stored and presented in association with a refill request testing module.

Accordingly, embodiments of the present invention may provide a mechanism by which messages and responses exchanged between a system under test and a testing platform may be stored. All stored information may be accessible by one or more users via a web browser type interface provided by the testing platform. The testing platform may also provide users with an ability to access specific messages and responses and even craft responses to certain request messages. Thus, users may be provided with relatively flexible access to testing systems or applications in a user friendly environment.

Figure 5:
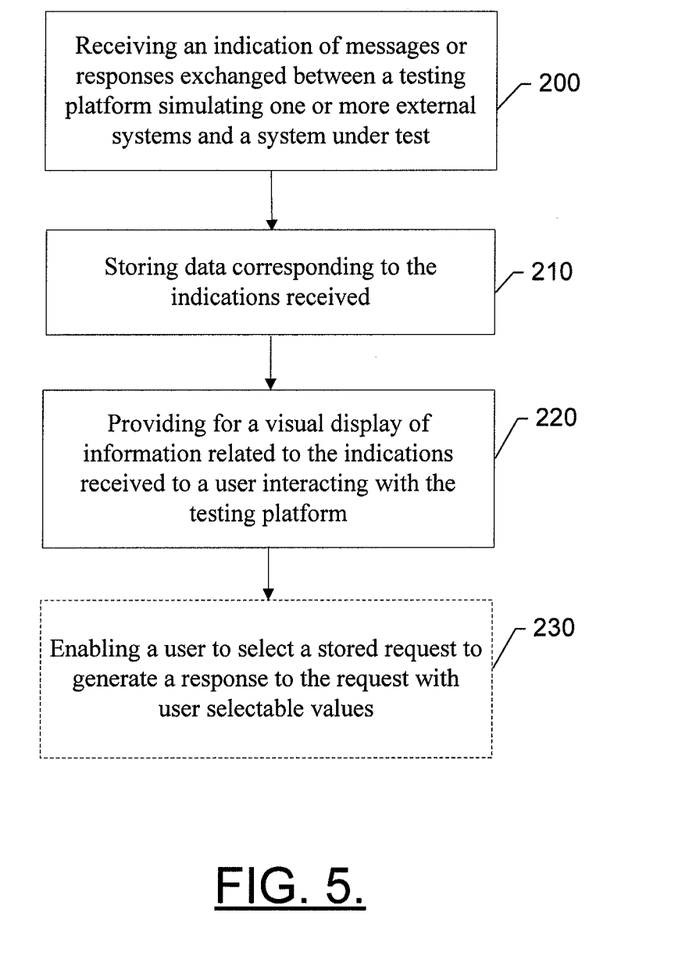
FIG. 5 illustrates a flowchart of a method of providing an interactive network simulator in accordance with an exemplary embodiment of the present invention.

FIG. 5 is a flowchart of a system, method and program product according to exemplary embodiments of the invention. It will be understood that each block of the flowchart, and combinations of blocks in the flowchart, may be implemented by various means, such as hardware, firmware, processor, circuitry and/or other device associated with execution of software including one or more computer program instructions. For example, one or more of the procedures described above may be embodied by computer program instructions. In this regard, the computer program instructions which embody the procedures described above may be stored by a memory device of a computing device and executed by a processor in the computing device. As will be appreciated, any such computer program instructions may be loaded onto a computer or other programmable apparatus (e.g., hardware) to produce a machine, such that the resulting computer or other programmable apparatus embody means for implementing the functions specified in the flowchart block(s). These computer program instructions may also be stored in a computer-readable memory that may direct a computer or other programmable apparatus to function in a particular manner, such that the instructions stored in the computer-readable memory produce an article of manufacture the execution of which implements the function specified in the flowchart block(s). The computer program instructions may also be loaded onto a computer or other programmable apparatus to cause a series of operations to be performed on the computer or other programmable apparatus to produce a computer-implemented process such that the instructions which execute on the computer or other programmable apparatus provide steps for implementing the functions specified in the flowchart block(s).

Accordingly, blocks of the flowchart support combinations of means for performing the specified functions, combinations of steps for performing the specified functions and program instruction means for performing the specified functions. It will also be understood that one or more blocks of the flowchart, and combinations of blocks in the flowchart, can be implemented by special purpose hardware-based computer systems which perform the specified functions or steps, or combinations of special purpose hardware and computer instructions.

In this regard, one embodiment of a method for providing an interactive network simulator, as shown in FIG. 5, includes receiving an indication of messages or responses exchanged between a testing platform simulating one or more external systems and a system under test at operation 200 and storing data corresponding to the indications received at operation 210. The method may further include providing for a visual display of information related to the indications received to a user interacting with the testing platform at operation 220.

In some embodiments, certain ones of the operations above may be modified or further amplified as described below. Moreover, in some cases, additional optional operations may be included (an example of which is shown in dashed lines in FIG. 5). It should be appreciated that each of the modifications or amplifications herein may be included with the operations and modifications above either alone or in combination with any others among the features described herein. In this regard, for example, the method may further include enabling a user to select a stored request to generate a response to the request with user selectable values at operation 230. In some embodiments, storing data corresponding to the indications received may include storing each message or response in association with an identity of an entity from which each respective message or response originated. In some cases, storing data may include storing corresponding messages or responses for a plurality of users. In an example embodiment, providing for the visual display may include providing a particular user of the plurality of users with a display only of messages or responses associated with the particular user. In some embodiments, providing for the visual display may include providing the visual display at a remote device of the user via a web browser.

In an exemplary embodiment, an apparatus for performing the method of FIG. 5 above may comprise a processor (e.g., the processor 52) configured to perform some or each of the operations (200-230) described above. The processor may, for example, be configured to perform the operations (200-230) by performing hardware implemented logical functions, executing stored instructions, or executing algorithms for performing each of the operations. Alternatively, the apparatus may comprise means for performing each of the operations described above. In this regard, according to an example embodiment, examples of means for performing operations 200-230 may comprise, for example, the processor 52, respective ones of the simulator engine 70 and the interface manager 71, and/or a device or circuit for executing instructions or executing an algorithm for processing information as described above.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus comprising processing circuitry configured to at least perform:
    modeling a plurality of sub-modules based in part on information indicative of one or more possible responses from respective sub-modules to outputs from a system under test;
    receiving an indication of messages exchanged between a testing platform simulating a plurality of external systems and the system under test;
    storing data corresponding to the indications received; and
    providing for a visual display of information related to the indications received to a user interacting with the testing platform,
    wherein the testing platform comprises a simulator engine and the plurality of sub-modules, each of the plurality of sub-modules configured to model a corresponding one of the plurality of external systems being tested for compatibility with the system under test.

2. The apparatus of claim 1, wherein the apparatus is accessible by a plurality of users to enable each respective user to conduct separate testing of the system under test.

3. The apparatus of claim 2, wherein the apparatus is remotely accessible via a network.

4. The apparatus of claim 1, wherein the processing circuitry is configured to store data corresponding to the indications received at least in part by storing each message in association with an identity of an entity from which each respective message originated.

5. The apparatus of claim 1, wherein the processing circuitry is configured to store data at least in part by storing corresponding messages for a plurality of users.

6. The apparatus of claim 5, wherein the processing circuitry is configured to provide for the visual display at least in part by providing a particular user of the plurality of users with a display only of messages associated with the particular user.

7. The apparatus of claim 1, wherein the processing circuitry is configured to provide for the visual display at least in part by providing the visual display at a remote device of the user via a web browser.

8. The apparatus of claim 1, wherein the processing circuitry is configured to enable the user to select a stored request to generate a response to the request with user selectable values.

9. The apparatus of claim 1, wherein the processing circuitry is configured to monitor the messages to evaluate performance criteria of the external systems.

10. A method comprising:
    modeling a plurality of sub-modules based in part on information indicative of one or more possible responses from respective sub-modules to outputs from a system under test;
    receiving an indication of messages exchanged between a testing platform simulating a plurality of external systems and the system under test;
    storing data corresponding to the indications received; and
    providing for a visual display of information related to the indications received to a user interacting with the testing platform,
    wherein the testing platform comprises a simulator engine and the plurality of sub-modules, each of the plurality of sub-modules configured to model a corresponding one of the plurality of external systems being tested for compatibility with the system under test.

11. The method of claim 10, wherein storing data corresponding to the indications received comprises storing each message in association with an identity of an entity from which each respective message originated.

12. The method of claim 10, wherein storing data comprises storing corresponding messages for a plurality of users.

13. The method of claim 12, wherein providing for the visual display comprises providing a particular user of the plurality of users with a display only of messages associated with the particular user.

14. The method of claim 10, wherein providing for the visual display comprises providing the visual display at a remote device of the user via a web browser.

15. The method of claim 10, further comprising enabling a user to select a stored request to generate a response to the request with user selectable values.

16. The method of claim 10, further comprising:
    monitoring the messages to evaluate performance criteria of the external systems.

17. A computer program product comprising at least one non-transitory computer-readable storage medium having computer-executable program code portions stored therein, the computer-executable program code portions comprising:

program code instructions for modeling a plurality of sub-modules based in part on information indicative of one or more possible responses from respective sub-modules to outputs from a system under test;

program code instructions for receiving an indication of messages exchanged between a testing platform simulating a plurality of external systems and the system under test;

program code instructions for storing data corresponding to the indications received; and     program code instructions for providing for a visual display of information related to the indications received to a user interacting with the testing platform,     wherein the testing platform comprises a simulator engine and the plurality of sub-modules, each of the plurality of sub-modules configured to model a corresponding one of the plurality of external systems being tested for compatibility with the system under test.

18. The computer program product of claim 17, wherein program code instructions for storing data corresponding to the indications received include instructions for storing each message in association with an identity of an entity from which each respective message originated.

19. The computer program product of claim 17, wherein program code instructions for storing data include instructions for storing corresponding messages for a plurality of users.

20. The computer program product of claim 19, wherein program code instructions for providing for the visual display include instructions for providing a particular user of the plurality of users with a display only of messages associated with the particular user.

21. The computer program product of claim 17, wherein program code instructions for providing for the visual display include instructions for providing the visual display at a remote device of the user via a web browser.

\* \* \* \* \*

UNITED STATES PATENT AND TRADEMARK OFFICE
CERTIFICATE OF CORRECTION

PATENT NO. : 8,660,833 B2
APPLICATION NO. : 12/647935
DATED : February 25, 2014
INVENTOR(S) : Pye It is certified that error appears in the above-identified patent and that said Letters Patent is hereby corrected as shown below:

Title page,
Item (73) Assignee: "McKesson Financial Holdings, Hamilton (BE)" should read --McKesson Financial Holdings, Hamilton (BM)--.

Signed and Sealed this
Seventeenth Day of June, 2014

Michelle K. Lee
*Deputy Director of the United States Patent and Trademark Office*